US006898775B2

(12) United States Patent
Erickson et al.

(10) Patent No.: US 6,898,775 B2
(45) Date of Patent: *May 24, 2005

(54) SYSTEM FOR ENSURING CORRECT PIN ASSIGNMENTS BETWEEN SYSTEM BOARD CONNECTIONS USING COMMON MAPPING FILES

(75) Inventors: Michael John Erickson, Loveland, CO (US); Paul J. Mantey, Fort Collins, CO (US); John S Atkinson, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/636,903

(22) Filed: Aug. 7, 2003

(65) Prior Publication Data

US 2004/0031012 A1 Feb. 12, 2004

Related U.S. Application Data

(62) Division of application No. 09/911,997, filed on Jul. 24, 2001, now Pat. No. 6,629,307.

(51) Int. Cl.[7] ............................................. G06F 17/50
(52) U.S. Cl. .............................. 716/15; 716/16; 716/17
(58) Field of Search ...................... 395/500.34, 500.44; 716/10, 15, 16, 17

(56) References Cited

U.S. PATENT DOCUMENTS

| | | | |
|---|---|---|---|
| 4,613,941 A | | 9/1986 | Smith et al. |
| 5,404,475 A | | 4/1995 | Fujisono et al. |
| 5,502,621 A | | 3/1996 | Schumacher et al. |
| 5,841,664 A | | 11/1998 | Cai et al. |
| 5,983,277 A | * | 11/1999 | Heile et al. ................. 709/232 |
| 6,009,256 A | * | 12/1999 | Tseng et al. .................. 703/13 |
| 2004/0034842 A1 | * | 2/2004 | Mantey et al. ................ 716/15 |

* cited by examiner

*Primary Examiner*—David Nelms
*Assistant Examiner*—Dao H. Nguyen

(57) ABSTRACT

The system of the invention ensures pin assignments between system board connections of printed circuit boards. A plurality of software configuration files define connections of a plurality of printed circuit boards. A mapping file correlates pin assignment attributes between the software configuration files. A processing section processes the configuration files and the mapping file to generate board schematics for the plurality of printed circuit boards with common pin assignment for the connections of each of the printed circuit boards. The software configuration files may include symbol files representing parts within the plurality of printed circuit boards. The software configuration files may include geometry files representing physical attributes of the parts. Changes to the design are automatically correlated to pin assignments through the boards and layout.

5 Claims, 2 Drawing Sheets

SYSTEM FOR ENSURING CORRECT PIN ASSIGNMENTS BETWEEN SYSTEM BOARD CONNECTIONS USING COMMON MAPPING FILES

RELATED APPLICATION

This application is a divisional of U.S. Ser. No. 09/911,997, filed Jul. 24, 2001, now U.S. Pat. No. 6,629,307, Entitled "Method For Ensuring Correct Pin Assignments Between System Board Connections Using Common Mapping Files" and is hereby incorporated by reference in its entirety.

BACKGROUND OF THE INVENTION

Engineering for a typical electronic product involves printed circuit board design and manufacture. Connectors to the circuit board are individually created to accommodate interfacing to other circuit boards and signals. Often, the pins of a connector are identified by corresponding pin numbers. These printed circuit boards are verified by engineers to ensure geometry, orientation and pin number association: the geometry and orientation verifications involve the physical attributes of the circuit board and parts; the pin number verification involves manual tracing of signal pathways through the pins of the connectors and through the underlying circuit boards.

Since signal names often vary from circuit board to circuit board, and since the connections to any given board may be highly dense and complex, the verifications involving signal and pin assignments has become increasingly difficult. Errors in pin assignment, or in signal associations to pins, are easily missed in schematic reviews, particularly with the larger and larger connectors utilized with printed circuit boards. In the development of large systems of the type that include many boards, one of the most common problems involves the misconnection of signals between boards.

It is, accordingly, one object of the invention to provide methods for mapping pin assignments within printed circuit board design architectures. Other objects of the invention are apparent within the description that follows.

SUMMARY OF THE INVENTION

In one aspect, the invention provides a method for assigning pin assignments across multiple printed circuit boards of a product, including the steps of: designing a first circuit board of the product through computer aided design software; designing a second circuit board of the product through computer aided design software; forming a mapping file for one or more pin assignments of the first connector; and automatically associating pin assignments of the second connector based upon the mapping file.

In another aspect, the method may include the steps of updating design characteristics involving pin assignments of a first connector of the first printed circuit board, through the computer aided design software, and automatically updating pin assignments of the mapping file to re-associate pin assignments of a second connector of the second printed circuit board. Updates may also be made to a second connector of the second printed circuit board, with similar automatic updating re-association of pin assignments on a first connector of the first printed circuit board.

In another aspect, the mapping file is defined from inputs through a user interface coupled to one or more user stations over a network.

The method may further include the step of forming a mapping file for one or more signal connections of the first printed circuit board. The method may further include the step of automatically associating signal connections of the second printed circuit board based upon the mapping file.

In still another aspect, a system is provided for ensuring pin assignments between system board connections of printed circuit boards. A plurality of software configuration files define connections of a plurality of printed circuit boards. At least one mapping file correlates pin assignment attributes between the software configuration files. A processing section processes the configuration files and the mapping file to generate board schematics for the plurality of printed circuit boards with common pin assignment for the connections of each of the printed circuit boards.

In one aspect, a common user interface couples one or more user stations to input design information to the configuration files.

The invention is next described further in connection with preferred embodiments, and it will become apparent that various additions, subtractions, and modifications can be made by those skilled in the art without departing from the scope of the invention.

BRIEF DESCRIPTION OF THE DRAWINGS

A more complete understanding of the invention may be obtained by reference to the drawings, in which.

DETAILED DESCRIPTION OF THE PREFERRED EMBODIMENTS

Figure 1:
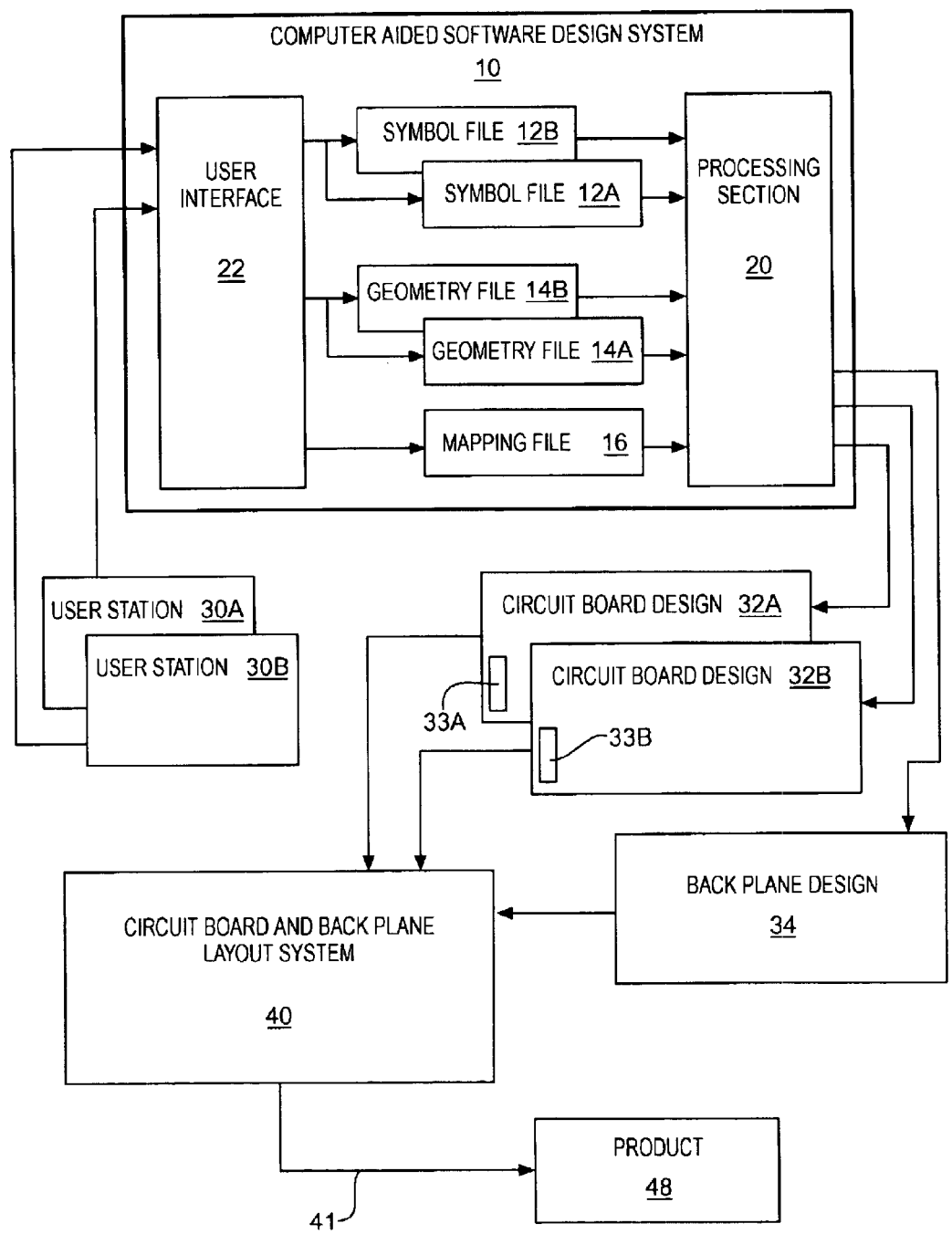
FIG. 1 shows a system for designing circuit boards ensuring pin and signal assignments across connectors, in accord with the invention.

FIG. 1 shows a system 10 of the invention for designing and producing printed circuit boards, associated back-planes and connectors in complex electrical products. System 10 provides for computer aided design of these components through processing of a plurality of symbol files 12, a plurality of geometry files 14, and at least one mapping file 16. A processing section 20 integrates files 12, 14, 16 to produce circuit board and back-plane designs 32, 34, respectively. Engineering designers input requirements to system 10 through user interface 22, and typically through one or more connected user stations (e.g., personal computers) 30. Designs 32, 34 may be integrated with a layout system 40 to produce physical circuit boards and back-planes corresponding to designs 32, 34. System 40 may for example provide input 41 to produce a product 48 from designs 32, 34.

Symbol files 12 represent one or more parts of designs 32. For example, symbol file 12A may represent a connector 33A within design 32A and symbol 12B may represent a connector 33B within design 32B. Within symbol files 12A, 12B, pins on a symbol are described by pin names and, if desired, by pin numbers correlating it to a pin within a geometry file (described below). Those skilled in the art should appreciate that additional symbol files 12 may be included within system 10—and usually are—to represent additional parts within designs 32.

Geometry files 14 represent physical aspects of one or more parts of designs 32, and typically also represent circuit board attributes required to accommodate these parts. For example, geometry file 14A may represent physical characteristics of connector 33A, and the physical attributes for connector 33A with the underlying circuit board design 32A;

geometry file 14B may represent physical characteristics of connector 33B, and the physical attributes for connector 33B with the underlying circuit board design 32B. Those skilled in the art should appreciate that additional geometry files 14 may be included within system 10—and usually are—to represent additional parts within designs 32.

Mapping file 16 ties together the representations of symbol and geometry files 12, 14 by linking pin names (or pin numbers) to physical pin geometries representing designs 32. Additional mapping files 16 may be included within system 10—and usually are—to facilitate mapping between additional parts within designs 32.

FIG. 1 illustrates two circuit board designs 32A, 32B and a single back-plane design 34; however those skilled in the art should appreciate that the number of board designs 32 and back-plane designs 34 is illustrative and not limiting. By way of example, board designs 32A, 32B may couple together with back-plane 34 for eventual use within a single product; an engineer at user station 30A may have design responsibility of circuit board design 32A and an engineer at user station 30B may have design responsibility of circuit board and back-plane design 32B, 34. System 10 operates to streamline the design process to ensure correct pin assignment and signal compatibility between designs 32, 34.

By way of example, system 10 creates symbols for connectors 33A, 33B within board designs 32A, 32B. Preferably, the same symbol pin names are used across designs 32A, 32B; this ensures that common signals through board designs 32A, 32B are appropriately mapped. For example, if a symbol "A" is mapped to pin "A1" on board design 32A, then preferably the same nomenclature is used within design 32B, so that signal A will map throughout the resulting board layout. System 10 also accounts for user error; for example if an engineer at station 30A introduces a mapping file 16 to map signal A to pin "A2" within board design 32A, and he should have mapped to pin A1, then signal A will nonetheless be similarly mapped within design 32B (mapping signal A to pin A2); and the resultant signal couples correctly between board designs 32A, 32B.

Figure 2:
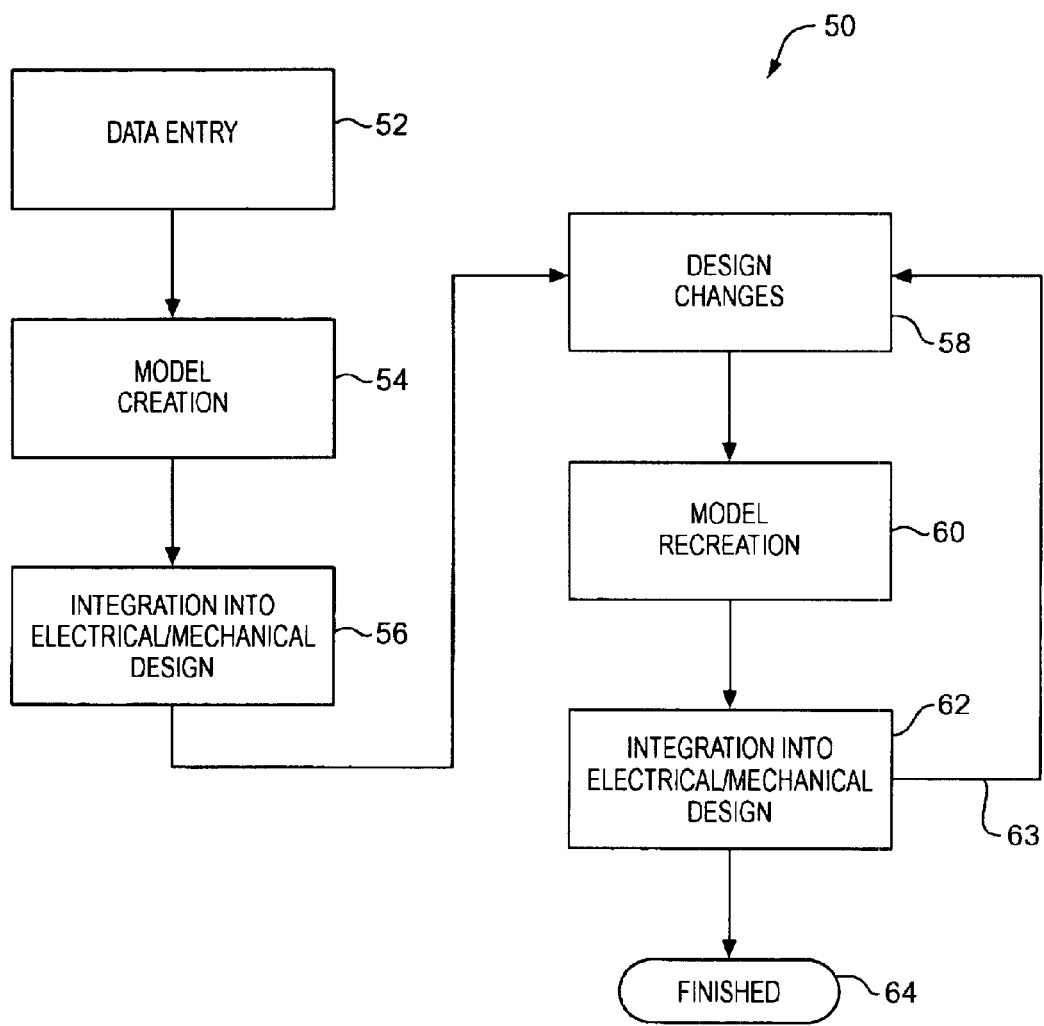
FIG. 2 shows a flow chart illustrating methods for designing circuits with pin and signal assignment integrity, in accord with the invention.

FIG. 2 illustrates a design flow 50 suitable for designing large systems or products involving circuit boards and connectors. Design flow 50 for example illustrates how a product 48, FIG. 1, may be designed using a system 10 of the invention. Step 52 is the data entry step; in step 52, design engineers input characteristics about the product design into system 10, e.g., through user interface 22. By way of example, in step 52, the signals required for connection between boards (e.g., represented by designs 32, FIG. 1) are entered into a list. Afterwards, at step 54, model creation determines the size and type of connectors required. By way of example, processing section 20 undertakes the model creation step 54 in determining the size and type of connectors 33A, 33B, based upon inputs (e.g., step 52) forming files 12, 14. Model creation step 54 may also determine power requirements and spare pin percentages, if desired. If board dimensions and connection locations are entered as input, to step 52, then model creation step 54 may also create the mechanical data for fit analysis. Furthermore, if certain data is entered at step 52 regarding the parts connecting signals and busses on each side of the connector, model creation step 54 may determine an optimal pin-out of how these signals associate with pins of the connector.

After data entry, therefore, model creation step 54 automatically creates symbols, mapping files, geometries of known parts, and mechanical data. In step 56, these are integrated to the electrical and/or mechanical designs of individual circuit boards. By way of comparison, processing section 20 utilizes files 12, 14, 16 to create designs 32, and based upon input to user interface 22. Within FIG. 2, step 56 illustrates the step of integrating the multiple designs 32 into a single system or product design.

Model creation step 54 and integration step 56 thus provide for schematic creation associated with the design of the electronic part, e.g., the layout of a printed circuit board, including component locations and signal routing. Changes to the design, at step 58, may affect mechanical features and/or electrical connection between circuit boards. When a step 58 change is made, inputs to the system (e.g., inputs to interface 22, FIG. 1) ensure that processor section 20 distributes the design changes to all affected boards; and these steps may not require personal interaction by the electrical designers. Design changes progress throughout the development of product 48, with model recreation step 60 maintaining coherency of the system level design after step 58 design changes. Step 62 illustrates subsequent integration of electrical and/or mechanical designs resulting from changes at step 58. The process may repeat, as indicated by arrow 63, until the design process completes with a finished product, step 64.

The invention has several advantages. Engineering designers using system 10, FIG. 1, may reduce the extra effort spent in providing for "spare connectors" within circuit boards, since signal and pin assignments are fully captured by system 10. Designers using CAD programs like Mentor may further see advantages in checking latent symbol or signal changes through system 10, as a built in check on the CAD software. The invention also provides a single point of interface (e.g., user interface 22) to design and acquire new schematics; a single set of pin assignments may utilized to agree, or not, on numbers and signal assignments.

The invention thus attains the objects set forth above, among those apparent from the preceding description. Since certain changes may be made in the above methods and systems without departing from the scope of the invention, it is intended that all matter contained in the above description or shown in the accompanying drawing be interpreted as illustrative and not in a limiting sense. It is also to be understood that the following claims are to cover all generic and specific features of the invention described herein, and all statements of the scope of the invention which, as a matter of language, might be said to fall there between.

What is claimed is:

1. A system for ensuring pin assignments between system board connections of printed circuit boards, comprising:
    software configuration files defining connections of a plurality of printed circuit board designs;
    at least one mapping file correlating pin assignment attributes between the software configuration files; and
    a processing section for processing the configuration files and the mapping file to generate board schematics for the plurality of printed circuit board designs with common pin assignment for the connections of each of the printed circuit boards.

2. The system of claim 1, further comprising a user interface for coupling to one or more user stations used to input design information to the configuration files.

3. The system of claim 2, further comprising a network coupling the user stations to the user interface.

4. The system of claim 1, wherein the software configuration files comprise symbol files representing parts within the plurality of printed circuit boards.

5. The system of claim 4, wherein the software configuration files comprise geometry files representing physical attributes of the parts.

* * * * *